(12) United States Patent
Galm et al.

(10) Patent No.: US 8,674,555 B2
(45) Date of Patent: Mar. 18, 2014

(54) NEUTRAL SWITCHING HIGH SPEED AC TRANSFER SWITCH

(75) Inventors: James M. Galm, Shaker Heights, OH (US); Ged Butkus, Kirtland, OH (US); Milind M. Bhanoo, Chagrin Falls, OH (US)

(73) Assignee: LayerZero Power Systems, Inc., Aurora, OH (US)

( * ) Notice: Subject to any disclaimer, the term of this patent is extended or adjusted under 35 U.S.C. 154(b) by 551 days.

(21) Appl. No.: 13/041,784

(22) Filed: Mar. 7, 2011

(65) Prior Publication Data
US 2012/0229191 A1 Sep. 13, 2012

(51) Int. Cl.
*B23K 11/24* (2006.01)
(52) U.S. Cl.
USPC .......................................... 307/112
(58) Field of Classification Search
USPC .......................................... 307/112
See application file for complete search history.

(56) References Cited

U.S. PATENT DOCUMENTS

| | | |
|---|---|---|
| 4,466,038 A | 8/1984 | Robertson |
| 4,543,493 A | 9/1985 | Stanley et al. |
| 4,618,906 A | 10/1986 | Paice et al. |
| 4,700,256 A | 10/1987 | Howell |
| 4,811,163 A | 3/1989 | Fletcher |
| 5,315,533 A | 5/1994 | Stich et al. |
| 5,555,182 A * | 9/1996 | Galm .............................. 702/69 |
| 5,644,175 A * | 7/1997 | Galm ............................ 307/131 |
| 5,770,897 A | 6/1998 | Bapat et al. |
| 5,793,586 A | 8/1998 | Rockot et al. |
| 5,814,904 A * | 9/1998 | Galm ............................ 307/130 |
| 6,051,893 A * | 4/2000 | Yamamoto et al. ............. 307/43 |
| 6,465,911 B1 * | 10/2002 | Takeda et al. ................... 307/70 |
| 6,630,752 B2 | 10/2003 | Fleming |
| 6,700,222 B2 | 3/2004 | Turvey |
| RE38,625 E | 10/2004 | Galm |
| 7,589,438 B2 * | 9/2009 | Galm ............................ 307/127 |
| 2006/0006742 A1* | 1/2006 | Galm .............................. 307/87 |
| 2010/0295374 A1* | 11/2010 | Nielsen et al. .................. 307/66 |

* cited by examiner

*Primary Examiner* — Jared Fureman
*Assistant Examiner* — Duc M Pham
(74) *Attorney, Agent, or Firm* — Rankin, Hill & Clark LLP (57) ABSTRACT

A hybrid neutral transfer switch in an electrical system to transfer a load between multiple AC power sources is provided. The hybrid neutral transfer switch includes a neutral gate controlled device connected to a neutral input of each of the multiple power sources and a mechanical transfer switch that switches between the neutral input of each of the power sources. During the transfer of power from one power source to another power source, the neutral gate controlled devices are activated and/or deactivated in conjunction with the switching of the mechanical transfer switch from one neutral input to another neutral input.

20 Claims, 4 Drawing Sheets

NEUTRAL SWITCHING HIGH SPEED AC TRANSFER SWITCH

BACKGROUND

The present invention relates to an electrical transfer switch and more specifically to the transfer of an electrical load from one power source to another power source incorporating a hybrid solid state/mechanical transfer switch.

In certain applications and/or environments, it is often important and sometimes critical to provide a back up power source in the event that a primary power becomes disabled or is not suitable for powering a load. For example, a large computer center or manufacturing plant may have access to two or more power sources to power some or all of its equipment. In these applications, it is important to be able to switch from one power source to the other power source without an interruption of power to the load. Further, during the transfer of power from one source to the other source it is important that power is never allowed to flow between the two sources.

Solid-state transfer switches (STS) are normally used in these critical environments where the load must remain powered, in the event that all or a portion of the electrical system fails. Solid-state transfer switches often include source quality monitoring facilities to automatically initiate a transfer from one source to another in the event that the active source fails. Since the solid-state transfer switch represents the place in the power system where multiple redundant sets of power sources and wiring come together to power the load, the transfer switch is a particularly critical machine. For that reason, solid-state transfer switches are designed for the utmost reliability and fault tolerance.

Solid state transfer switches utilize a pair of gate activated silicon controlled rectifiers or SCRs connected in parallel. Each pair of SCRs conducts current from a single pole of alternating current to a load. One SCR conducts current in one direction and a second oppositely connected SCR conducts current in a second direction as the AC source switches polarity. When both SCRs are gated into conduction, Each SCR provides a low resistance path for alternating current power as the current flow alternates back and forth during the AC power cycle. Transferring from a faulty power source to an alternate power source requires that the active or conducting SCRs be de-activated and a second set of SCR pairs be activated to connect the alternate power source to the load.

U.S. Pat. No. 7,589,438 to Galm, the inventor of the present application, the contents of which are incorporated by reference in its entirety, discloses a transfer switch apparatus and method to quickly and efficiently transfer a load from one power source to another power source. The power sources, however, do not include a neutral connection. A power source, which includes a neutral connection, may be desirable in certain circumstances to provide voltage and current stability and to support single phase loads connected from one of the three phases to the neutral conductor.

In power source applications that include a neutral connection, when the load is transferred from one power source to another power source, the neutral connection must be transferred as well. Ground current caused by a steady state voltage between the neutral and ground, can produce undesirable effects if solid state transfer switches utilizing parallel SCRs are used as the switching device. For example, when parallel SCRs are used as the transfer switch for the neutral connection, a 2.4 V p-p square wave is always present across the parallel SCRs, which in turn creates a voltage between neutral and ground at the load. Thus, because the neutral is bonded to ground at the source, a current is generated in the ground conductor, which can trip a GFCI device if applied for a sustained period of time, thereby interrupting power to the load.

In addition, the voltage created across the phase to neutral connected loads generates harmonics across the load. The presence of harmonics across the load can adversely affect the operation of the load.

One solution to eliminate the ground current is to replace the parallel connected SCRs switching the neutral conductor with a mechanical transfer switch. Mechanical transfer switches, however, do not switch fast enough to maintain continuity of the neutral current during the transfer from one power source to the other power source.

Thus, what is required is a neutral conductor transfer means that provides the advantages of both the solid state transfer switch and the mechanical transfer switch while simultaneously eliminating the disadvantages of each switch.

SUMMARY

In accordance with one aspect, a neutral transfer switch in an electrical system to transfer a load between a plurality of AC power sources is provided. The neutral transfer switch includes a gate controlled device connected to a neutral input of each of the plurality of power sources and a mechanical transfer switch switchably connected to the neutral input of each of the plurality of power sources. When one of the plurality of power sources is active and supplying power to the load, the gate controlled device associated with the active power source is active, the mechanical transfer switch is connected to the neutral input of the active power source, the mechanical transfer switch is connected in parallel with the gate controlled device associated with the active power source, and current from the active power source is flowing through the mechanical transfer switch to the load.

In accordance with another aspect, a hybrid transfer switch in an electrical system to transfer a load from a first power source to a second power source is provided. The hybrid transfer switch includes a first gate controlled device connected to the first power source, a second gate controlled device connected to the second power source, and a mechanical transfer switch switchably connected to the first power source and the second power source. When the first power source is supplying power to the load, the first gate controlled device is active, the mechanical transfer switch is connected to the first power source, the mechanical transfer switch is connected in parallel with the first gate controlled device, and current from the first power source is flowing through the mechanical transfer switch to the load. Further, when the second power source is supplying power to the load, the second gate controlled device is active, the mechanical transfer switch is connected to the second power source, the mechanical transfer switch is connected in parallel with the second gate controlled device, and current from the second power source is flowing through the mechanical transfer switch to the load.

In accordance with yet another aspect, a switching apparatus to transfer power to a load from a first power source to a second power source is provided and includes a first set of phase gate controlled devices connected to a first set of phase inputs of the first power source, a second set of phase gate controlled devices connected to a second set of phase inputs of the second power source, a first neutral gate controlled device connected to a first neutral input of the first power source, a second neutral gate controlled device connected to a second neutral input of the second power source, and a mechanical transfer switch switchably connected to the first neutral input of the first power source and the second neutral input of the second power source. When the first power source is supplying power to the load, the first neutral gate controlled device is active, the mechanical transfer switch is connected to the first neutral input of the first power source, the mechanical transfer switch is connected in parallel with the first neutral gate controlled device, and current from the first neutral input of the first power source is flowing through the mechanical transfer switch to the load. Further, when the second power source is supplying power to the load, the second neutral gate controlled device is active, the mechanical transfer switch is connected to the second neutral input of the second power source, the mechanical transfer switch is connected in parallel with the second neutral gate controlled device, and current from the second neutral input of the second power source is flowing through the mechanical transfer switch to the load.

In accordance with still another aspect, a method to transfer power to a load from an active power source to an inactive power source is provided and includes at time $t_0$, deactivating an active set of gate controlled devices connected to a first set of inputs of the active power source, activating an inactive neutral gate controlled device connected to a neutral input of the inactive power source, at time $t_1$, activating an inactive set of phase gate controlled devices connected to a second set of phase inputs of the inactive power source, at time $t_2$, disconnecting a mechanical transfer switch from a neutral input of the active power source, and at time $t_3$, connecting the mechanical transfer switch to the neutral input of the inactive power source.

DETAILED DESCRIPTION

Figure 1:
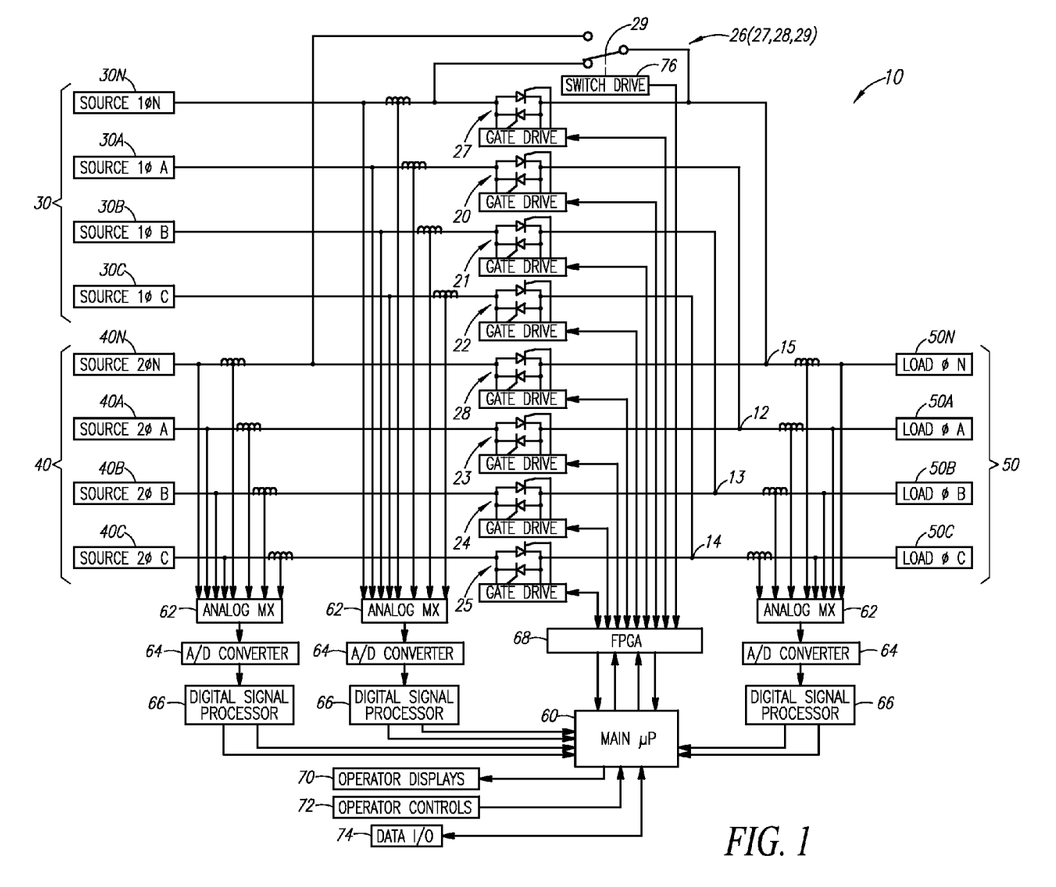
FIG. 1 is a schematic of a three phase-four wire electrical system utilizing transfer switches in accordance with the present invention to transfer power from one source to an alternate source to power an associated load.

Referring now to the drawings, FIG. 1 illustrates a three phase-four wire electrical system 10 that provides the means to transfer power from one power source to an alternative power source to provide uninterrupted power to a load. As mentioned above, environments exist where it is critical where that the load must remain powered, in the event that all or a portion of the electrical system fails as, for example, in a computer center. It is to be understood that the present invention can be incorporated in an electrical system that includes alternate AC single phase or polyphase power sources. Further, the electrical system incorporating the present invention may be configured to handle more than two alternate power sources. For the purpose of simplicity, however, the present invention will be described with reference to a load connected to receive power from one of only two three phase power sources. Thus, the embodiment shown in the figures and described herein is for illustrative purposes only and is not intended to limit the scope of the invention.

The electrical system 10 provides alternate current paths to three common phase junctions 12, 13, 14 through a first set of three electrical transfer switches 20, 21, 22 for phase A, phase B, and phase C respectively of an associated first power source 30, and a second set of three electrical transfer switches 23, 24, 25 for phase A, phase B, and phase C of an associated second power source 40. The electrical system 10 further provides alternate current paths through a common neutral junction 15 via a hybrid neutral transfer switch 26 (hereinafter "neutral transfer switch 26") for a neutral connection associated with both the first power source 30 and the second power source 40. Both the first set and the second set of three electrical transfer switches 20-25, are gate controlled current carrying devices (hereinafter "phase gate controlled devices 20-25") that are coupled to the phase junctions 12, 13, 14. The neutral transfer switch 26 is coupled to the neutral junction 15.

The first three phase-four wire power source 30 is coupled to a first set of four inputs comprised of a first set of three phase inputs 30A, 30B, 30C and a first neutral input 30N. The second three phase-four wire power source 40 is coupled to a second set of four inputs comprised of a second set of three phase inputs 40A, 40B, 40C and a second neutral input 40N. A load 50, which includes three phase load connections 50A, 50B, 50C, and a neutral load connection 50N, is powered by either the first power source 30 or the second power source 40. Thus, the three phase load connections 50A, 50B, 50C, and the neutral load connection 50N are coupled to either the first set of four inputs 30A, 30B, 30C, 30N or the second set of four inputs 40A, 40B, 40C, 40N.

A controller 60 is provided to monitor the condition of the alternating current signals from the first power source 30 and the second power source 40 by means of signal conditioning circuits and sensors. As depicted in FIG. 1 the sensors are connected to the controller 60 by means of an analog multiplexor circuitry 62, an analog to digital converter 64, and a digital signal processor 66. Under certain specified conditions monitored by the controller 60, a transfer of power is initiated from the first power source 30 to the second power source 40 or vice versa. Thus, as will be subsequently described, to initiate the transfer of power, the controller 60 de-activates the active gate controlled devices and activates the inactive gate controlled devices.

The transfer of power from one power source to the other power source relating to the first set of phase inputs 30A, 30B, 30C and the second set of phase inputs 40A, 40B, 40C is well known and will only be briefly described. The power transfer from one power source to the other power source relating to the first set of phase inputs 30A, 30B, 30C and the second set of phase inputs 40A, 40B, 40C and to the first and second neutral inputs 30N, 40N will be described further below. It should be noted, however, that the transfer of power between all four inputs 30A, 30B, 30C, 30N of the first power source 30 and all four inputs 40A, 40B, 40C, 40N of the second power source 40 occur substantially at the same time.

To switch from one power source to the other power source, the controller 60 deactivates the active phase gate controlled devices, for example, 20-22, and activates the inactive phase gate controlled devices, for example, 23-25. In accordance with known design, each gate controlled device includes a pair of gate-activated silicon controlled rectifiers (SCRs) that are connected in parallel. Each pair of SCRs conducts current from a single pole of alternating current from one of the sources to a load, with one SCR of the pair conducting current in one direction and the other oppositely connected SCR conducting current in the other direction as the AC source changes polarity. When both SCRs are gated into conduction, first one and then the other SCR provides a low resistance path for alternating current power as current flow alternates back and forth during the AC power cycle. Stated another way, during half the AC power cycle one of the two SCRs is forward biased and carries current to the load and during the other half of the AC power cycle the second of the two SCRs is forward biased and carries current to the load. To switch from one power source to another, the controller 60 deactivates the active gate controlled devices set by removing gate signals from gate inputs of the two parallel-path, opposite-sense current-carrying SCRs, which combine to form an active gate controlled device.

To perform a safe, yet efficient transfer of power through the phase junctions 12, 13 and 14 from one power source to the other power source, the controller 60 initiates a transfer and relies upon a field programmable gate array (FPGA) controller 68 to supervise the shutdown of the active gate controlled devices and start up the inactive gate controlled devices.

The operation of each of the phase gate controlled devices 20-25 and the activation and deactivation of the SCRs associated with each of these phase gate controlled devices 20-25 by means of the FPGA controller 68 is well known, and need not be described in detail. The FPGA controller 68 senses current through the two SCRs of each active phase gate controlled device 20-25 to determine a current carrying state for that gate controlled device. When a transfer is initiated, the FPGA controller 68 deactivates the gate control signals of the off going source and monitors the current carrying state of the SCRs just deactivated. When the current flowing through the deactivated SCRs becomes of sufficiently low magnitude for a sufficiently long time, the FPGA controller 68 activates the gate control signals of the on coming source.

As further indicated in FIG. 1, the controller 60 is also connected to conventional peripheral devices to allow monitoring and control operation of the control system, including suitable operator displays 70 and controls 72 usually provided on an operator control panel, and data input/output devices 74.

The main controller 60 executes a stored sequence of processing steps that constitute the main logic for the operation of the system. The main controller 60 is programmed using any suitable programming language, such as C, to execute all of the necessary functions of the control system, including decision making, maintenance of stored logs, communication with operators, reporting errors and sequencing of orderly system start up and shut down. Most of these functions are relatively routine, and the particular mode of operation and programming used to accomplish these functions is routine and need not be explained in detail.

Still referring to FIG. 1, the neutral transfer switch 26 includes a first neutral gate controlled device 27 associated with the first power source 30, a second neutral gate controlled device 28 associated with the second power source 40, and a mechanical transfer switch 29. As mentioned above, the neutral transfer switch 26 is a hybrid switch that provides the advantages of both a solid state transfer switch, such as the gate controlled devices disclosed herein, and a mechanical transfer switch while simultaneously eliminating the disadvantages of each switch.

Although the first neutral gate controlled device 27 and the second neutral gate controlled device 28 are similar in nature to the phase gate controlled devices 20-25 above, the operation of the first neutral gate controlled device 27 and the second neutral gate controlled device 28 differs from the phase gate controlled devices 20-25 during the transfer of power transfer from one power source to another power source. Specifically, when the transfer of power is initiated, the SCRs on the oncoming side neutral are gated on immediately and do not wait for the SCRs in the off going neutral to reduce to the appropriate level. The reason for this is that the on coming source neutral SCRs must be active to provide a current path from the on coming phases to the neutral conductor of the on coming source.

Further, to perform a safe, yet efficient transfer of power through the neutral junction 15 from one power source to other power source, the controller 60 initiates a transfer and again relies upon the FPGA controller 68 to supervise the operation the first and second neutral gate controlled devices 27, 28.

The mechanical transfer switch 29 is a single pole double throw (SPDT) transfer switch that switches between the first neutral input 30N and the second neutral input 40N. Thus, the mechanical transfer switch 29 provides an electrical connection from the neutral input 30N, 40N of either the first power source 30 or the second power source 40 respectively to the neutral load connection 50N. Depending on which power source 30, 40 is active, the mechanical transfer switch 29 is connected in parallel with either the first neutral gate controlled device 27 or the second neutral gate controlled device 28 In other words, when the first power source 30 is active, the mechanical transfer switch 29 is connected in parallel with the first neutral gate controlled device 27. Similarly, when the second power source 40 is active, the mechanical transfer switch 29 is connected in parallel with the second neutral gate controlled device 28.

The mechanical transfer switch 29 may be a break-before-make type or a make-before-break type switch. In the example embodiment described herein and shown in the figures, a break-before-make mechanical transfer switch will be used when describing the switching sequence during the transfer of power from one power source to the other power source. Thus, the embodiment described herein and shown in the figures is for illustrative purposes only and is not intended to limit the scope of the invention.

The mechanical transfer switch 29 includes a switch drive 76. The switch drive 76 operates the mechanical transfer switch 29 to switch between the first neutral input 30N and the second neutral input 40N. The FPGA controller 68 communicates with the switch drive 76 to supervise the switching process of the mechanical transfer switch 29. During the power transfer process, the controller 60 initiates the switching of the mechanical transfer switch 29 but relies upon the FPGA controller 68 to supervise the switching of the mechanical transfer switch 29.

During normal operation, the mechanical transfer switch 29 provides a path for continuous current between either the first neutral input 30N of the first power source 30 and the neutral load connection 50N or the second neutral input 40N of the second power source 40 and the neutral load connection 50N. It should be noted that in this state, the neutral gate controlled device of the neutral switch 26 associated with the active power source remains active. The voltage drop across the mechanical transfer switch 29, however, is lower than the conduction threshold voltage of the neutral SCRs. Thus, the current from the active neutral input will flow though the mechanical transfer switch 29 and not through the active neutral gate controlled device. This arrangement also serves a backup path for the neutral current in the event that the mechanical transfer switch fails.

Figure 2:
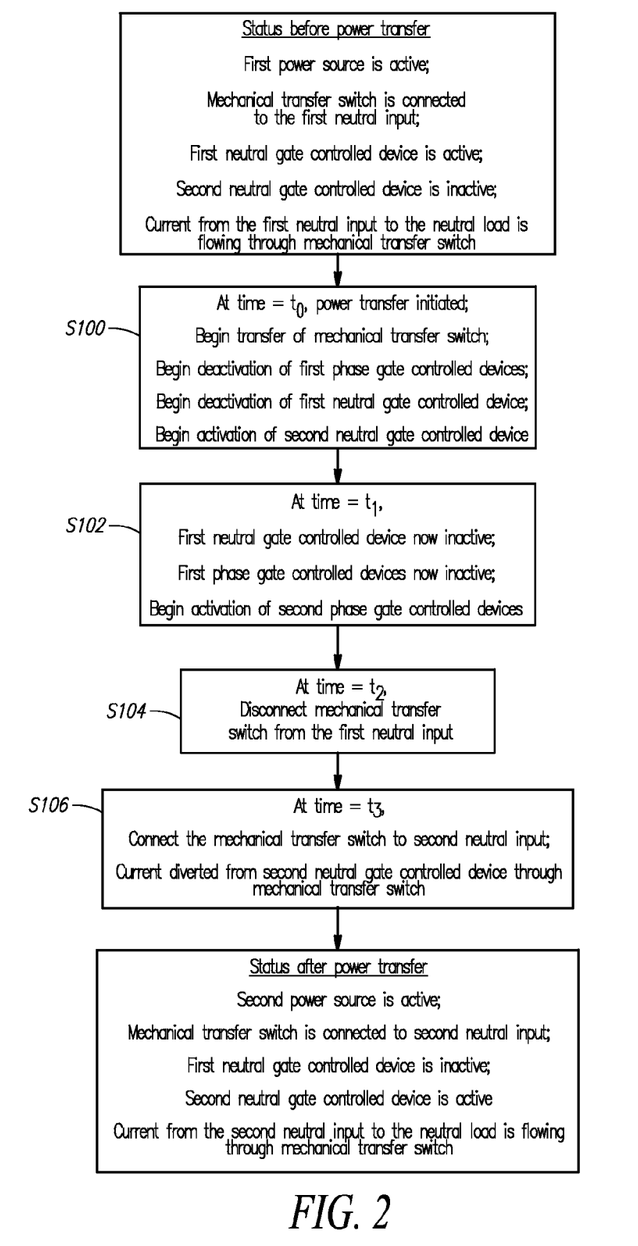
FIG. 2 is a flowchart illustrating the sequence of transferring power to a load from one power source to another power source.
Figure 3A:
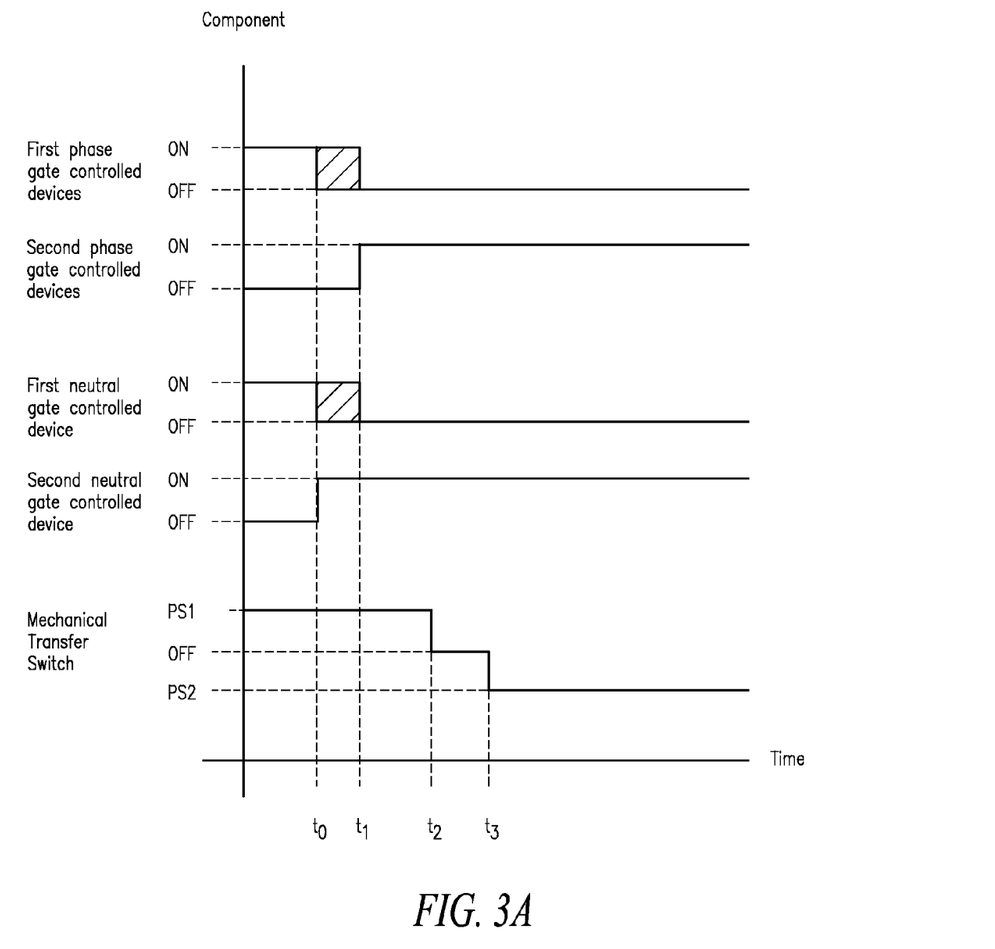
FIGS. 3A and 3B are graphs illustrating timing of the sequence illustrated in FIG. 2.
Figure 3B:
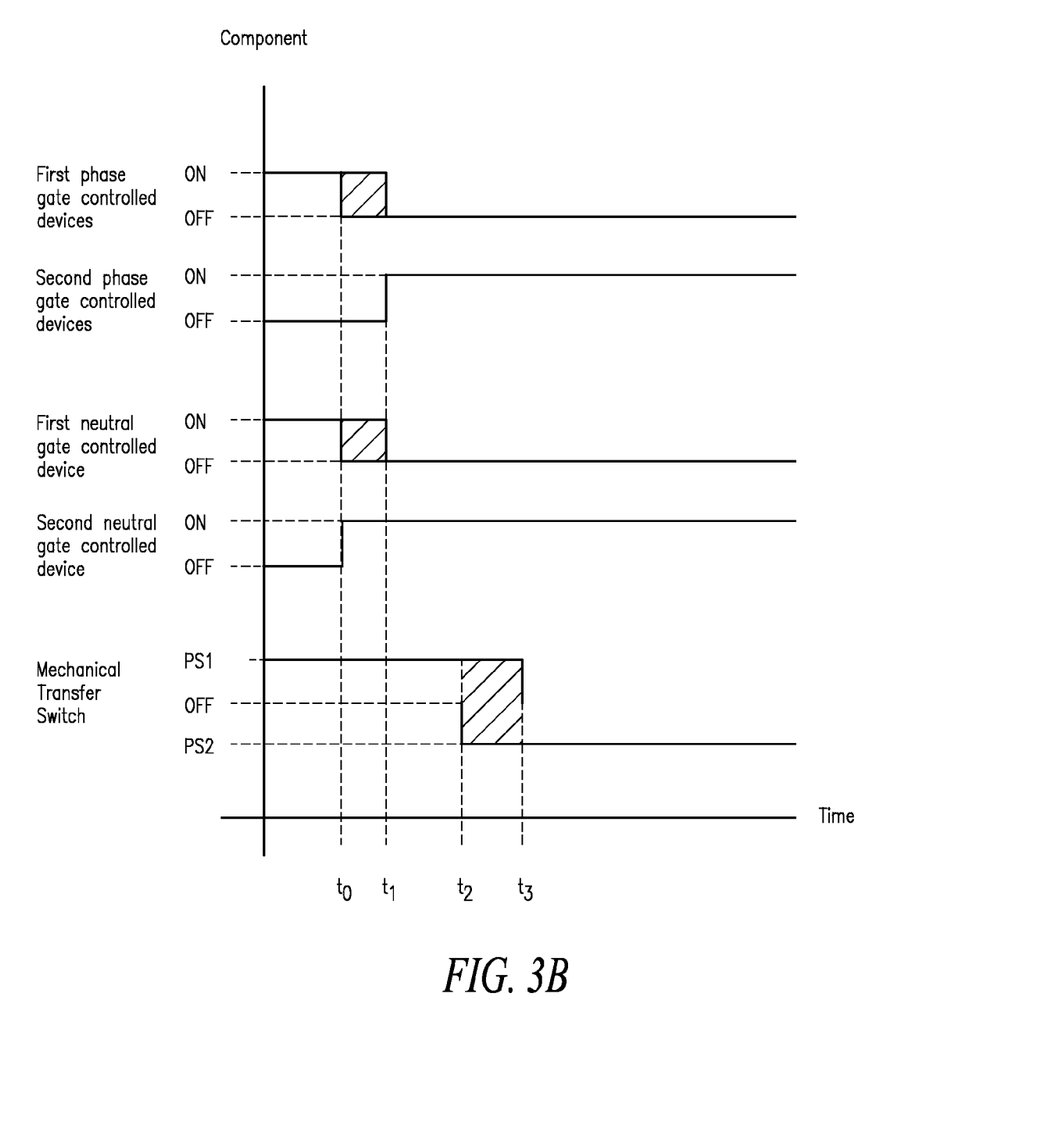

Referring to the flowchart in FIG. 2 and to the graph in FIG. 3, the switching sequence for the transfer of power to the load 50 from the first phase inputs 30A, 30B, 30C and the first neutral input 30N of the first power source 30 to the second phase inputs 40A, 40B, 40C and the second neutral input 40N of the second power source 40 will now be described. For simplicity, in describing the transfer of power to the load 50, the following is assumed at a time prior to $t_0$: 1) that the first power source 30 is active and is currently supplying power to the load 50; 2) that the first neutral gate controlled device 27 is active but, as mentioned above, the current from the first neutral input 30N to the neutral load 50N is flowing through the mechanical transfer switch 29; and 3) the second neutral gate controlled device 28 is inactive. In addition, in regards to FIG. 3, PS1 refers to the first power source 30 and PS2 refers to the second power source 40.

In step S100, at a time=$t_0$, the controller 60 initiates a power transfer command to transfer power from one power source (the first power source 30 in this example) to another power source (the second power source 40 in this example). Thus, at time $t_0$, the following operations are initiated: 1) transfer of the mechanical transfer switch 29; 2) deactivation of the first phase gate controlled devices 20-22; 3) deactivation of the first neutral gate controlled device 27; and 4) activation of the second neutral gate controlled device 28. Note that at this point in the transfer, the first neutral input 30N and the second neutral input 40N are connected. This condition is not prohibited because the duration of the connection between the first and second neutral inputs 30N, 40N is very short.

In step S102, at time $t_1$, when the magnitude of the current flowing through the deactivated SCRs of the first phase gate controlled devices 20-22 is sufficiently low and the SCRs go into blocking mode, the second phase gate controlled devices 23-25 are activated and current begins to flow through the SCRs of the second phase gate controlled devices 23-25. Further, at time $t_1$, the first neutral gate controlled device 27 is now inactive. Thus, the time period between $t_0$ and $t_1$ (shaded in FIG. 3) regarding the first phase gate controlled devices 20-22 and the first neutral gate controlled device 27 is the time where the gate controlled devices 20-22 and 27 begin deactivation till a time when the magnitude of the current flowing through the SCRs of these deactivated devices is sufficiently low such that the SCRs go into blocking mode. Thus, at time $t_1$, the first phase gate controlled devices 20-22 and the first neutral gate controlled device 27 are inactive In step S104, at time $t_2$, the mechanical transfer switch 29 is disconnected from the first neutral input 30N and is in an "OFF" position, as shown in FIG. 3. Although, the transfer of the mechanical transfer switch 29 is initiated at time $t_0$, as indicated at step S100 above, it is not until time $t_2$ that the mechanical transfer switch 29 is disconnected from the first neutral input 30N because the mechanical transfer switch 29 does not begin movement instantaneously. Rather, the mechanical transfer switch 29 requires time to begin moving after the power transfer command is given.

In step S106, at a time=$t_3$, the mechanical transfer switch 29 is connected to the second neutral input 40N. Once the mechanical transfer switch 29 is connected to the second neutral input 40N, current from the second neutral input 40N is diverted from the second neutral gate controlled device 28 through the mechanical transfer switch 29. Again, as mentioned above, the second neutral gate controlled device 28 will remain active, but the current will flow through the mechanical transfer switch 29 because the voltage drop across the mechanical transfer switch 29 is lower than the conduction threshold voltage of the neutral SCRs.

As mentioned above, the mechanical transfer switch 29 may be a break-before-make type switch described herein or a make-before-break type switch. Referring to FIG. 3B, in the case of the latter, at time $t_2$, the mechanical transfer switch 29 would connect to the second neutral input 40N of the second power source 40 and at time $t_3$, the mechanical transfer switch 29 would then disconnect from the first neutral input 30N of the first power source 30. Thus, the connection to the second neutral input 40N would be made before the connection from the first neutral input 30N would break. This overlap between $t_2$ and $t_3$ is represented by the shaded area in FIG. 3B.

The transfer of power from the first power 30 to the second power source 40 is now complete. Thus, after the transfer, the second power source 40 is now active, the second neutral gate controlled device 28 is active but, the current from the second neutral input 40N to the neutral load connection 50N is flowing through the mechanical transfer switch 29, and the first neutral gate controlled device 27 is inactive.

The arrangement and sequence of the electrical system 10 previously described eliminates any disruption of power to the load due to a ground current generated in the neutral connection, as when only solid state switches are used as the neutral transfer switch described above. Specifically, when the second neutral gate controlled device 28 is active a voltage is created between neutral and ground at the load, which in turn generates a current in the ground conductor, as described further above. Once the mechanical transfer switch 29, however, is connected to the second neutral input 40N at time t3, the current is diverted from the second gate controlled device 28 through the mechanical transfer switch 29 thereby eliminating the voltage between the neutral and ground. Thus, the current in the ground conductor is eliminated. The temporary existence of the current in the ground conductor does not trip the GFCI, because the duration that the second neutral gate controlled device 28 is active until the mechanical transfer switch 29 is connected to the second neutral input 40N, is short, for example, in the range of 20-100 ms. This short time period is not long enough to trip the GFCI. Thus, power to the load is not interrupted due to the ground current during the transfer of power from one power source to the other power source.

An STS comprised of solid state phase switches combined with a hybrid solid state/mechanical neutral transfer switch described above eliminates the shortcomings of both the solid state neutral transfer switch and the mechanical neutral transfer switch but has the advantages of each switch. For example, the hybrid switch maintains continuity of the neutral current during the transfer of power. Further, the hybrid switch creates a negligible voltage between neutral and ground at the load location and, thus, essentially eliminating the ground current associated with the solid state switch.

It will be appreciated that various features and functions, or alternatives or varieties thereof of the above disclosed, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A neutral transfer switch in an electrical system to transfer a load between a plurality of AC power sources, the neutral transfer switch comprising:
   a gate controlled device connected to a neutral input of each of the plurality of power sources;
   a mechanical transfer switch switchably connected to the neutral input of each of the plurality of power sources;
   wherein when one of the plurality of power sources is active and supplying power to the load, the gate controlled device associated with the active power source is active, the mechanical transfer switch is connected to the neutral input of the active power source, the mechanical transfer switch is connected in parallel with the gate controlled device associated with the active power source, and current from the active power source is flowing through the mechanical transfer switch to the load.

2. The neutral transfer switch of claim 1, wherein when one of the plurality of power sources is supplying power to the load and a transfer command is initiated to transfer power from the one of the plurality of power sources to another of the plurality of power sources, at a time $t_0$, transfer of the mechanical transfer switch is initiated, deactivation of the gate controlled device associated with the off going power source is initiated, and activation of the gate controlled device associated with the oncoming power source is initiated such that the neutral input of the off going power source and the neutral input of the on coming power source are temporarily connected and current flows through the oncoming gate controlled device to the load, and wherein at a time $t_1$, deactivation of the off going gate controlled device is complete.

3. The neutral transfer switch of claim 2, wherein at a time $t_2$, the mechanical transfer switch is disconnected from the neutral input of the off going power source thereby disconnecting the neutral inputs of the off going power and the on coming power source, and wherein at a time $t_3$, the mechanical transfer switch is connected to the neutral input of the on coming power source and the current from the neutral input of the oncoming power source is diverted from the oncoming gate controlled device through the mechanical transfer switch to the load.

4. The neutral transfer switch of claim 3, wherein the off going gate controlled device includes a first set of plurality of silicon controlled rectifiers connected in parallel, and wherein the oncoming gate controlled device includes a second set of plurality of silicon controlled rectifiers connected in parallel.

5. The neutral transfer switch of claim 4, wherein a main controller and a gate array controller are provided to control the activation and deactivation of the gate controlled devices connected to the neutral input of the plurality of power sources and the switching of the mechanical transfer switch.

6. A hybrid transfer switch in an electrical system to transfer a load from a first power source to a second power source, the hybrid transfer switch comprising:
a first gate controlled device connected to the first power source;
a second gate controlled device connected to the second power source;
a mechanical transfer switch switchably connected to the first power source and the second power source,
wherein when the first power source is supplying power to the load, the first gate controlled device is active, the mechanical transfer switch is connected to the first power source, the mechanical transfer switch is connected in parallel with the first gate controlled device, and current from the first power source is flowing through the mechanical transfer switch to the load, and
wherein when the second power source is supplying power to the load, the second gate controlled device is active, the mechanical transfer switch is connected to the second power source, the mechanical transfer switch is connected in parallel with the second gate controlled device, and current from the second power source is flowing through the mechanical transfer switch to the load.

7. The hybrid transfer switch of claim 6, wherein the first gate controlled device is connected to a first neutral input of the first power source, the second gate controlled device is connected to a second neutral input of the second power source, and the mechanical transfer switch switches between the first neutral input and the second neutral input.

8. The hybrid transfer switch of claim 7, wherein when the first power source is active and supplying power to the load and a transfer command is initiated to transfer power from the first power source to the second power source, at a time $t_0$, transfer of the mechanical transfer switch is initiated, deactivation of the first gate controlled device is initiated, and the second gate controlled device is activated such that the first neutral input of the first power source and the second neutral input of the second power source are temporarily connected and current flows through the second gate controlled device to the load, and wherein at a time $t_1$, deactivation of the first gate controlled device is complete.

9. The hybrid transfer switch of claim 8, wherein at a time $t_2$, the mechanical transfer switch is connected to the second neutral input and the current from the second neutral input is diverted from the second gate controlled device through the mechanical transfer switch to the load, and wherein at a time $t_3$, the mechanical transfer switch is disconnected from the first neutral input.

10. The hybrid transfer switch of claim 9, wherein the first gate controlled device includes a first pair of silicon controlled rectifiers connected in parallel, and wherein the second gate controlled device includes a second pair of silicon controlled rectifiers connected in parallel.

11. The hybrid transfer switch of claim 10, wherein a main controller and a gate array controller are provided to control the activation and deactivation of the first gate controlled device and the second gate controlled device and the switching of the mechanical transfer switch.

12. A switching apparatus to transfer power to a load from a first power source to a second power source comprising:
a first set of phase gate controlled devices connected to a first set of phase inputs of the first power source;
a second set of phase gate controlled devices connected to a second set of phase inputs of the second power source;
a first neutral gate controlled device connected to a first neutral input of the first power source;
a second neutral gate controlled device connected to a second neutral input of the second power source;
a mechanical transfer switch switchably connected to the first neutral input of the first power source and the second neutral input of the second power source,
wherein when the first power source is supplying power to the load, the first neutral gate controlled device is active, the mechanical transfer switch is connected to the first neutral input of the first power source, the mechanical transfer switch is connected in parallel with the first neutral gate controlled device, and current from the first neutral input of the first power source is flowing through the mechanical transfer switch to the load, and
wherein when the second power source is supplying power to the load, the second neutral gate controlled device is active, the mechanical transfer switch is connected to the second neutral input of the second power source, the mechanical transfer switch is connected in parallel with the second neutral gate controlled device, and current from the second neutral input of the second power source is flowing through the mechanical transfer switch to the load.

13. The switching apparatus of claim 12, wherein when the first power source is active and supplying power to the load and a transfer command is initiated to transfer power from the first power source to the second power source, at a time $t_0$, transfer of the mechanical transfer switch is initiated, deactivation of the first set of phase gate controlled devices is initiated, deactivation of the first gate controlled device is initiated, and the second gate controlled device is activated such that the first neutral input of the first power source and the second neutral input of the second power source are temporarily connected and a current flows through the second gate controlled device to the load.

14. The switching apparatus of claim 13, wherein at a time $t_1$, the second set of phase gate controlled devices are activated and deactivation of the first set of phase gate controlled devices and the first gate controlled device is complete.

15. The switching apparatus of claim 14, wherein at a time $t_2$, the mechanical transfer switch is disconnected from the first neutral input thereby disconnecting the first neutral input and the second neutral input, and wherein at a time $t_3$, the mechanical transfer switch is connected to the second neutral input and current from the second neutral input is diverted from the second neutral gate controlled device through the mechanical transfer switch to the load.

16. A method to transfer power to a load from an active power source to an inactive power source comprising:
   at time $t_0$
      initiating a transfer of a mechanical transfer switch;
      deactivating an active set of gate controlled devices connected to a first set of inputs of the active power source;
      activating an inactive neutral gate controlled device connected to a neutral input of the inactive power source;
   at time $t_1$
      activating an inactive set of phase gate controlled devices connected to a second set of phase inputs of the inactive power source;
   at time $t_2$
      disconnecting the mechanical transfer switch from a neutral input of the active power source or connecting the mechanical transfer switch to the neutral input of the inactive power source; and
   at time $t_3$
      connecting the mechanical transfer switch to the neutral input of the inactive power source or disconnecting the mechanical transfer switch from a neutral input of the active power source.

17. The method of claim 16 further comprising diverting current from the inactive neutral gate controlled device of the inactive power source through the mechanical transfer switch.

18. The method of claim 17, wherein deactivating an active set of gate controlled devices includes:
   deactivating an active set of phase gate controlled devices connected to a first set of phase inputs of the active power source; and
   deactivating an active neutral gate controlled device connected to the neutral input of the active power source.

19. The method of claim 18, wherein at time $t_0$, upon activating the inactive neutral gate controlled device connected to the neutral input of the inactive power source, the neutral input of the active power source and the neutral input of the inactive power are temporarily connected.

20. The method of claim 19, wherein at time $t_2$, upon disconnecting the mechanical transfer switch from the neutral input of the active power source, the neutral input of the active power source and the neutral input of the inactive power source are disconnected.

* * * * *